United States Patent
Yu et al.

[11] Patent Number: 5,877,046
[45] Date of Patent: Mar. 2, 1999

[54] METHODS OF FORMING SEMICONDUCTOR-ON-INSULATOR SUBSTRATES

[75] Inventors: Sun-il Yu; Woo-tag Kang, both of Seoul, Rep. of Korea

[73] Assignee: Samsung Electronics Co., Ltd., Suwon, Rep. of Korea

[21] Appl. No.: 835,605

[22] Filed: Apr. 9, 1997

[30] Foreign Application Priority Data

Apr. 9, 1996 [KR] Rep. of Korea ............ 1996-10604

[51] Int. Cl.$^6$ ............................................ H01L 21/336
[52] U.S. Cl. .................. 438/151; 438/164; 438/977; 438/459; 438/455; 257/349; 257/347
[58] Field of Search ........................ 438/30, 39, 149, 438/164, 151, 977, 155, 136, 138, 184, 201, 485, 455, 459; 257/57, 66, 347, 349

[56] References Cited

U.S. PATENT DOCUMENTS

| | | | |
|---|---|---|---|
| 4,396,933 | 8/1983 | Magdo et al. ........................ | 357/50 |
| 4,814,287 | 3/1989 | Takemoto et al. ................... | 437/62 |
| 5,055,898 | 10/1991 | Beilstein, Jr. et al. ............. | 357/23.6 |
| 5,145,802 | 9/1992 | Tyson et al. ......................... | 437/63 |
| 5,296,086 | 3/1994 | Takasu . | |
| 5,308,779 | 5/1994 | Sarma . | |
| 5,317,181 | 5/1994 | Tyson ................................... | 257/347 |
| 5,326,991 | 7/1994 | Takasu ................................. | 257/77 |
| 5,405,795 | 4/1995 | Beyer et al. ......................... | 437/41 |
| 5,437,762 | 8/1995 | Ochiai et al. ........................ | 216/20 |
| 5,474,952 | 12/1995 | Fujii . | |
| 5,489,792 | 2/1996 | Hu et al. .............................. | 257/347 |
| 5,518,953 | 5/1996 | Takasu . | |
| 5,536,950 | 7/1996 | Liu et al. ............................. | 257/59 |
| 5,578,865 | 11/1996 | Vu et al. .............................. | 257/611 |
| 5,587,604 | 12/1996 | Machesney et al. ................. | 257/350 |
| 5,591,650 | 1/1997 | Hsu et al. ............................ | 437/21 |
| 5,597,739 | 1/1997 | Sumi et al. . | |
| 5,612,230 | 3/1997 | Yuzurihara et al. . | |
| 5,633,182 | 5/1997 | Miyawaki et al. .................. | 438/30 |

OTHER PUBLICATIONS

S.M. Sze, *The Silicon–On–Insulator MOSFET*, High–Speed Semiconductor Devices, Chapter 3, A Wiley–Interscience Publication, 1990, pp. 190–197 No Month.

*Primary Examiner*—Mary Wilczewski
*Attorney, Agent, or Firm*—Myers Bigel Sibley & Sajovec

[57] ABSTRACT

Methods of forming semiconductor-on-insulator substrates include the steps of forming a underlying semiconductor layer to electrically interconnect a plurality of SOI active regions and thereby prevent one or more of the active regions from "floating" relative to the other active regions. The reduction of floating body effects (FBE) improves the I-V characteristics of SOI devices including SOI MOSFETs. A method is provided which includes the steps of forming a second electrically insulating layer having a plurality of first openings therein, on a first face of a first semiconductor substrate. A first semiconductor layer is then formed on the second electrically insulating layer so that direct electrical connections are made between the first semiconductor layer and the first semiconductor substrate. A first electrically insulating layer is then formed on the first semiconductor layer. This first electrically insulating layer is then planarized and bonded to a second semiconductor substrate. The composite intermediate structure is then inverted and followed by the step of planarizing a second face of the first semiconductor substrate to define a second semiconductor layer. A plurality of spaced semiconductor active regions are then defined in the second semiconductor layer by using field oxide isolation techniques to consume the entire thickness of the second semiconductor layer at predetermined spaced locations. This step essentially isolates the active regions from each other, however, these active regions do not "float" because they are electrically connected to each other indirectly through the underlying first semiconductor layer.

18 Claims, 4 Drawing Sheets

METHODS OF FORMING SEMICONDUCTOR-ON-INSULATOR SUBSTRATES

FIELD OF THE INVENTION

The present invention relates to semiconductor devices and fabrication methods, and more particularly to methods of fabricating semiconductor-on-insulator devices and devices formed thereby.

BACKGROUND OF THE INVENTION

Electronic devices may be formed on thin-film silicon-on-insulator (SOI) substrates with reduced short channel effects, reduced parasitic and nodal capacitances, increased radiation hardness, reduced susceptibility to parasitic thyristor latch-up and reduced process complexity compared to bulk semiconductor devices. In addition, fully depleted SOI devices (e.g., FETs) may offer reduced short channel effects (SCE), near ideal sub-threshold slope, increased transconductance and reduced threshold voltage sensitivity to changes in body doping, channel length, temperature and substrate voltage. The "kink" effect and threshold voltage shifts caused by body charging are also significantly reduced in fully depleted SOI devices.

But conventional SOI devices have a "floating body" in which the body or channel region of the device (e.g., FET) is located on an insulator and is not electrically connected to a fixed potential. Devices susceptible to floating body effects (FBE) can experience high leakage current and parasitic bipolar action. As will be understood by those skilled in the art, these limitations can be reduced by providing a contact to the body so that a fixed potential can be applied thereto. Unfortunately, the use of body contacts typically increases the size of SOI devices. Attempts have also been made to limit FBE by providing non-uniformly doped channel regions, however, the use of non-uniformly doped channel regions may cause a shift in a device's threshold voltage.

One attempt to form an SOI MOSFET according to the prior art is disclosed in FIGS. 1–4. In particular, FIG. 1 illustrates an SOI MOSFET comprising an insulating layer 12 on a semiconductor substrate 10 and a plurality of field oxide isolation regions 14 on the insulating layer 12. An active region extending between adjacent field oxide isolation regions 14 comprises source, channel and drain regions 18, 20 and 16, respectively. An insulated gate electrode is also provided on the channel region 20. The insulated gate electrode comprises a gate oxide layer 22 and a gate electrode 23. A passivation layer 26 is also provided on the field oxide isolation regions 14 and insulated gate electrode. Contact holes 28 are provided in the passivation layer 26 and source and drain contacts 30 are provided in the contact holes 28.

Referring now to FIGS. 2–4, a method of forming the SOI MOSFET of FIG. 1 will be described. In particular, FIG. 2 illustrates the steps of forming an insulating layer 12 on a face of a semiconductor substrate 10 and then forming a semiconductor layer 13 (e.g., N-type or P-type silicon) on the insulating layer 12. Then, a plurality of field oxide isolation regions 14 are provided in the semiconductor layer 13 to define semiconductor active regions extending therebetween. An insulated gate electrode 24, comprising a gate oxide layer 22 and a gate electrode 23, is then formed on an active region using conventional techniques. Source and drain region dopants of predetermined conductivity type are then implanted into the active region (using the insulated gate electrode as an implant mask) to define self-aligned source and drain regions 18 and 16, respectively. As will be understood by those skilled in the art, the edges of the source and drain regions define a channel region 20 therebetween. Here, for example, the semiconductor layer 13 may be of P-type conductivity and the source and drain region dopants may be of N-type conductivity. Referring now to FIG. 4, a passivation layer 26 (e.g., BPSG) is then formed on the intermediate structure of FIG. 3. Contact holes 28 are then patterned in the passivation layer 26 using conventional techniques, to expose the source and drain regions 18 and 16. A layer of metallization is then deposited into the contact holes 28 and patterned to define source and drain electrodes 30.

As illustrated, the SOI MOSFET of FIGS. 1 and 4 is isolated from adjacent devices by the field oxide isolation regions 14 and the insulating layer 12. Unfortunately, such isolation typically causes floating body effects (FBE) which may include the accumulation of holes in the channel region 20 in the event the MOSFET is an NMOS device. As will be understood by those skilled in the art, such floating body effects can cause threshold voltage shift and adversely effect the I-V characteristics of the MOSFET.

Thus, notwithstanding prior art attempts to form SOI substrates and devices, there still continues to be a need for improved methods of forming SOI substrates and devices so that devices formed therein derive the above described benefits of SOI isolation, but do not suffer from excessive floating body and short channel effects.

SUMMARY OF THE INVENTION

It is therefore an object of the present invention to provide improved methods of forming semiconductor-on-insulator substrates and devices and structures formed thereby.

It is another object of the present invention to provide methods of forming semiconductor-on-insulator substrates with reduced susceptibility to floating body effects and devices and structures formed thereby.

It is still a further object of the present invention to provide methods of forming semiconductor-on-insulator substrates with improved short-channel effects and devices and structures formed thereby.

These and other objects, features and advantages of the present invention are provided by methods of forming semiconductor-on-insulator (SOI) substrates which include the steps of forming a underlying semiconductor layer to electrically interconnect a plurality of SOI active regions and thereby prevent one or more of the active regions from "floating" relative to the other active regions, and structures and devices formed thereby. As will be understood by those skilled in the art, the reduction of floating body effects (FBE) improves the I-V characteristics of SOI devices including SOI MOSFETs. The use of an interconnecting semiconductor layer may also improve the punchthrough characteristics of SOI MOSFETs by limiting short channel effects.

In particular, according to one embodiment of the present invention, a method is provided which includes the steps of forming a second electrically insulating layer (e.g., $SiO_2$) on a first face of a first semiconductor substrate (e.g., monocrystalline silicon) and then patterning the second electrically insulating layer to define a plurality of first openings therein which expose respective portions of the first face of the first semiconductor substrate. A first semiconductor layer is then formed on the second electrically insulating layer and in the plurality of first openings therein so that direct electrical connections (e.g., ohmic contacts) are made between the first semiconductor layer and the first semiconductor substrate.

The first semiconductor layer may be formed by conformally depositing a blanket layer of polycrystalline silicon on the second electrically insulating layer and the openings therein using conventional techniques. A first electrically insulating layer (e.g., $SiO_2$) is then formed on the first semiconductor layer. This first electrically insulating layer is then planarized and bonded to a second semiconductor substrate. The composite intermediate structure is then inverted and followed by the step of planarizing a second face of the first semiconductor substrate to define a second semiconductor layer which extends opposite the second electrically insulating layer and the plurality of first openings therein.

As will be understood by those skilled in the art, the above sequence of steps will result in the formation of a second semiconductor layer which is electrically connected to the underlying first semiconductor layer at the plurality of first openings in the second electrically insulating layer. Using conventional techniques, a plurality of spaced semiconductor active regions are then defined in the second semiconductor layer by using field oxide isolation techniques to consume the entire thickness of the second semiconductor layer at predetermined spaced locations. This step essentially isolates the active regions from each other so that they behave as SOI active regions, however, these active regions do not "float" because they are electrically connected to each other indirectly through the underlying first semiconductor layer which is preferably a doped polycrystalline silicon layer.

According to another aspect of the present invention, semiconductor devices are then formed in the spaced semiconductor active regions. In particular, at least one field effect transistor may be formed in a respective active region by patterning an insulated gate electrode on the active region and then forming self-aligned source and drain regions in the active region. Preferably, to improve the I-V characteristics of the field effect transistor, the source and drain regions are define in spaced relation so that the channel region extending therebetween overlaps a respective opening in the second electrically insulating layer and is electrically connected to the underlying first semiconductor layer. According to another aspect of the present invention, the source region is also defined so that it forms a rectifying or nonrectifying junction with the first semiconductor layer at a respective opening. A direct electrical connection may also be made between the first semiconductor layer and a source electrode or contact, by filling a contact hole in an adjacent field oxide isolation region with metallization.

DESCRIPTION OF PREFERRED EMBODIMENTS

Figure 1:
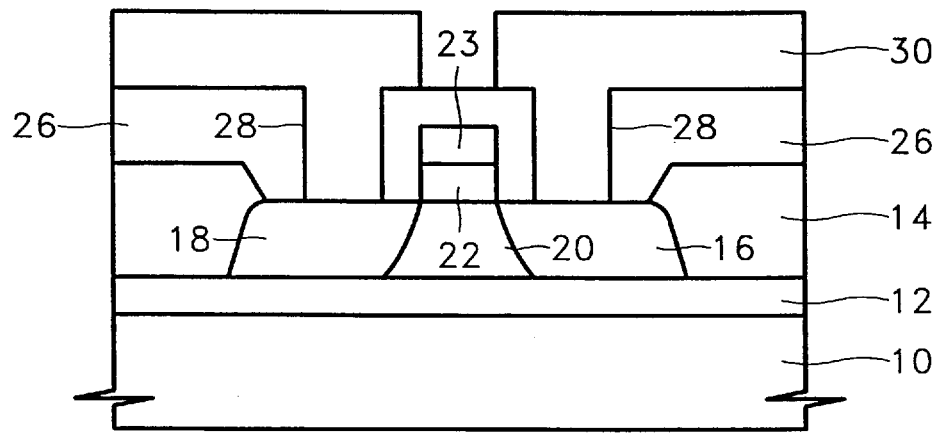
FIGS. 1–4 illustrate schematic cross-sectional views of intermediate structures illustrating a method of forming a silicon-on-insulator field effect transistor, according to the prior art.
Figure 2:
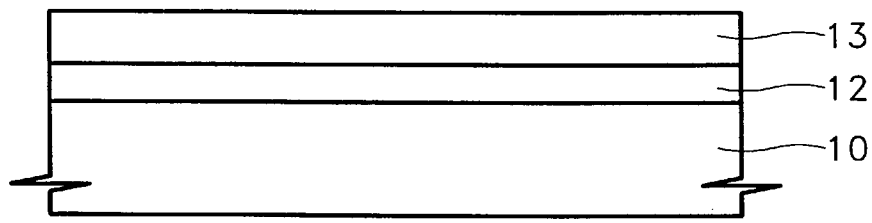
Figure 3:
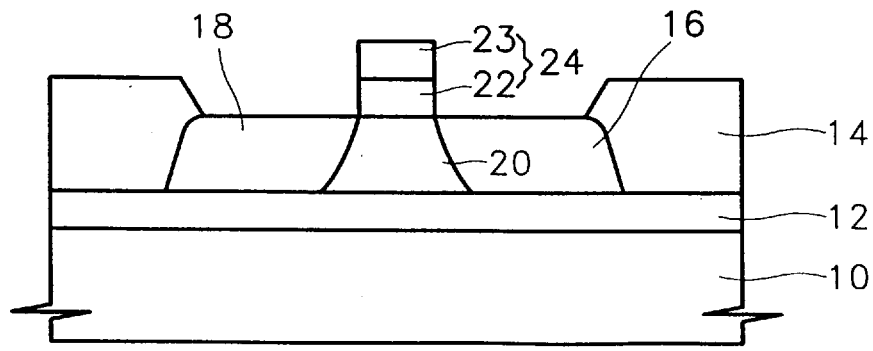
Figure 4:
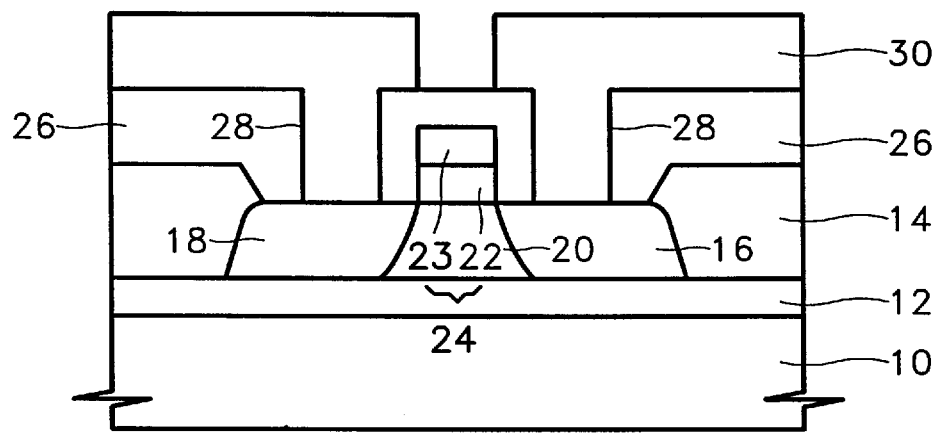

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as P or N-type, however, each embodiment described and illustrated herein includes its complementary embodiment as well.

Figure 5:
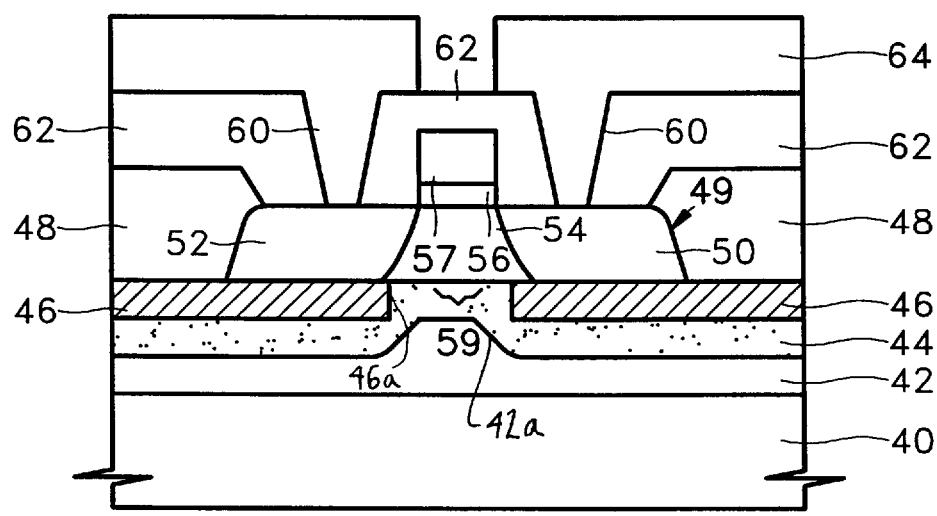
FIG. 5 illustrates a schematic cross-sectional view of a semiconductor-on-insulator semiconductor device according to a first embodiment of the present invention.

Referring now to FIG. 5, a semiconductor-on-insulator (SOI) semiconductor device according to a first embodiment of the present invention will be described. In particular, according to the first embodiment of the present invention, a second semiconductor substrate 40 is provided having a first electrically insulating layer 42 thereon, as illustrated. The first electrically insulating layer 42 may comprise a layer of silicon dioxide (i.e., $SiO_2$) and is preferably formed to have a planarized surface in contact with the second semiconductor substrate 40 to which it is bonded and an opposing first surface having insulating mesas 42a extending therefrom. As illustrated, these insulating mesas 42a have convexly contoured surface profiles.

A first semiconductor layer 44 is also provided on the first surface of the first electrically insulating layer 42, to cover the insulating mesas 42a. This first semiconductor layer 44 is preferably doped to a predetermined level with dopants of first or second conductivity type. A second electrically insulating layer 46 (e.g., $SiO_2$) is also provided on the first semiconductor layer 44. The second electrically insulating layer 46 has a plurality of first openings 46a therein. As described more fully hereinbelow with respect to FIGS. 8–11, the insulating mesas 42a are self-aligned to respective first openings 46a, by conformally depositing a first semiconductor layer 44 on the second electrically insulating layer 46 (and in the first openings 46a) and then conformally depositing a first electrically insulating layer 42 on the first semiconductor layer 44.

Referring still to FIG. 5, a semiconductor active region 49 is also provided on the second electrically insulating layer 46, in contact with the first semiconductor layer 44 at the first opening 46a. Field oxide isolation regions 48 are also provided to electrically isolate adjacent active regions 49 from each other. These field oxide isolation regions 48 have a greater thickness than the adjacent active regions 49. An insulated gate electrode 59, comprising a gate insulating layer 56 and a gate electrode 57, are also provided on the semiconductor active region 49, as illustrated. Source and drain regions 52 and 50, respectively, of a field effect transistor are also formed in a self-aligned manner in the semiconductor active region 49, as explained more fully hereinbelow. The source and drain regions 52 and 50, respectively, define a channel region 54 therebetween. This channel region 54 may be centered over a respective first opening 46a and in ohmic contact with the first semiconductor layer 44 to limit floating body effects (FBE) from occurring by preventing charge carriers (e.g., holes) from being trapped in the channel region 54. Short channel effects are also reduced because the first semiconductor layer 44 operates as a punchthrough barrier.

A passivation layer 62, which may comprise borophosphosilicate glass (BPSG), is also provided on the semiconductor active region 49, insulated gate electrode 59 and field oxide isolation regions 48, as illustrated. Contact holes 60 may also be defined in the passivation layer 62 to expose the source and drain regions 52 and 50, as illustrated. A layer of metallization may then be deposited on the passivation layer 62 and in the contact holes 60. The layer of metallization may then be patterned as source and drain electrodes or contacts 64, using conventional techniques.

Figure 6:
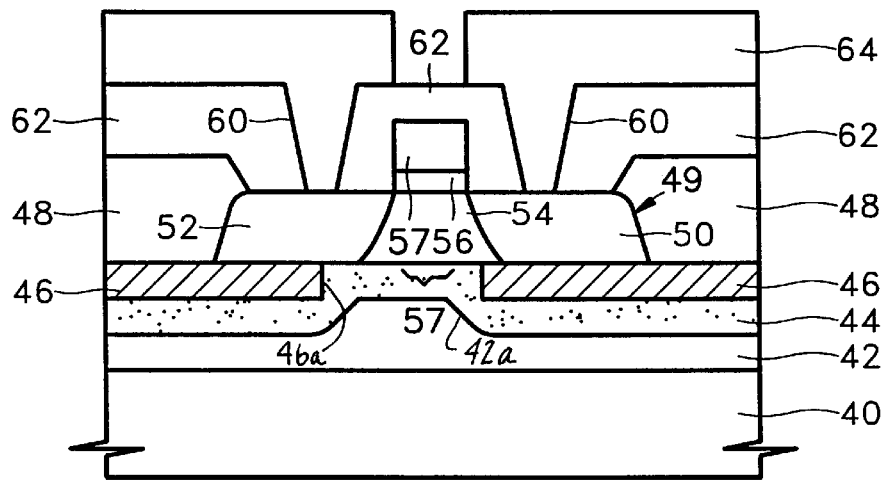
FIG. 6 illustrates a schematic cross-sectional view of a semiconductor-on-insulator semiconductor device according to a second embodiment of the present invention.

Referring now to FIG. 6, a semiconductor-on-insulator (SOI) semiconductor device according to a second embodiment of the present invention will be described. This second embodiment is similar to first embodiment, however, the insulated gate electrode 59 is preferably patterned to be laterally offset from the center of a respective first opening 46a so that the subsequently formed self-aligned source region 52 also contacts the first semiconductor layer 44 at the first opening 46a. When a portion of the source region 52 as well as the channel region 54 contacts the first semiconductor layer 44, charge carriers (e.g., holes) in the junction portion of the channel region 54 and the source region 52 are more easily removed. Therefore, the influences of floating body effects (FBE) are more effectively reduced and any change in the threshold voltage ($V_{th}$) of the field effect transistor is more effectively prevented relative to the first embodiment.

Figure 7:
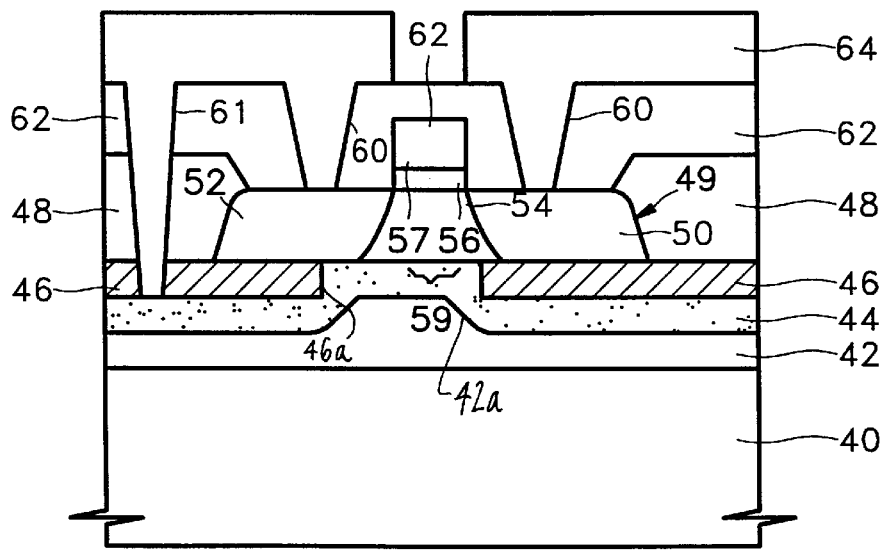
FIG. 7 illustrates a schematic cross-sectional view of a semiconductor-on-insulator semiconductor device according to a third embodiment of the present invention.
Figure 8:
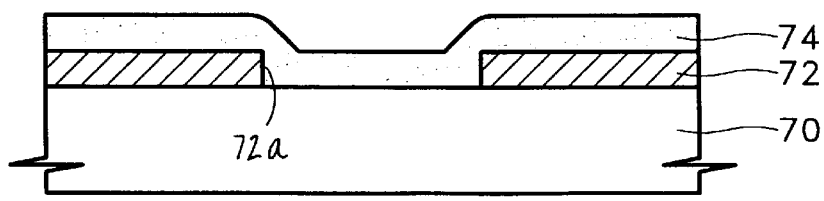
FIGS. 8–11 illustrate schematic cross-sectional views of intermediate structures illustrating a method of forming the semiconductor-on-insulator semiconductor device of FIG. 7.

Referring now to FIG. 7, a semiconductor-on-insulator (SOI) semiconductor device according to a third embodiment of the present invention will be described. This third embodiment is similar to the second embodiment, however, a contact hole 61 is also formed in the passivation layer 62, a field oxide isolation region 48 and the second electrically insulating layer 46 to expose the first semiconductor layer 44. A layer of metallization is also patterned in the contact hole 61 to form a preferred source contact 64. This preferred source contact 64, which preferably ohmically contacts the first semiconductor layer 44, further reduces the occurrence of floating body effects.

Referring now to FIGS. 8–11, a preferred method of forming the semiconductor-on-insulator semiconductor device of FIG. 7 will be described. In particular, as illustrated best by FIG. 8, a preferred method includes the steps of forming a second electrically insulating layer 72 on a first face of a first semiconductor substrate 70 (e.g., a monocrystalline silicon wafer). The second electrically insulating layer 72 may comprise a layer of silicon dioxide ($SiO_2$). The second electrically insulating layer 72 is then patterned using conventional techniques to define a plurality of first openings 72a therein which expose respective portions of the first face of the first semiconductor substrate 70. A first semiconductor layer 74 is then formed on the patterned second electrically insulating layer 72 and in the first openings 72a in contact with the first face of the semiconductor substrate 70. The first semiconductor layer 74 may comprise a blanket polycrystalline silicon layer of first or second conductivity type which is conformally deposited on the patterned second electrically insulating layer 72. According to one aspect of the present invention, the first semiconductor layer 74 is doped to have a dopant concentration of $1 \times 10^{20}$ cm$^{-3}$. As determined by the inventors herein, it may be possible to lessen any stress caused by the differences in the coefficients of thermal expansion between the second electrically insulating layer 72 and the first semiconductor layer 74 by forming them to appropriate thicknesses. As a result, it is possible to reduce junction leakage current typically caused by subsequently performed wafer bonding steps.

Figure 9:
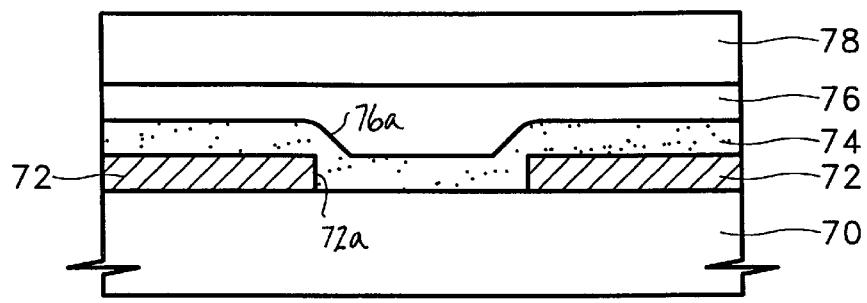

Referring now to FIG. 9, a first electrically insulating layer 76 is then formed on the first semiconductor layer 74. The first electrically insulating layer 76 may be formed by conformally depositing a blanket layer of silicon dioxide. Here, the profile of the first electrically insulating layer 76 at the interface with the first semiconductor layer 74 has self-aligned convexly contoured mesas 76a extending into respective ones of the first openings 72a. The first electrically insulating layer 76 is then planarized at an upper surface. Here, a chemical-mechanical polishing (CMP) step may be performed to planarize the first electrically insulating layer 76. A second substrate 78 (e.g., monocrystalline silicon) is then bonded to the planarized surface of the first electrically insulating layer 76, using conventional techniques.

Figure 10:
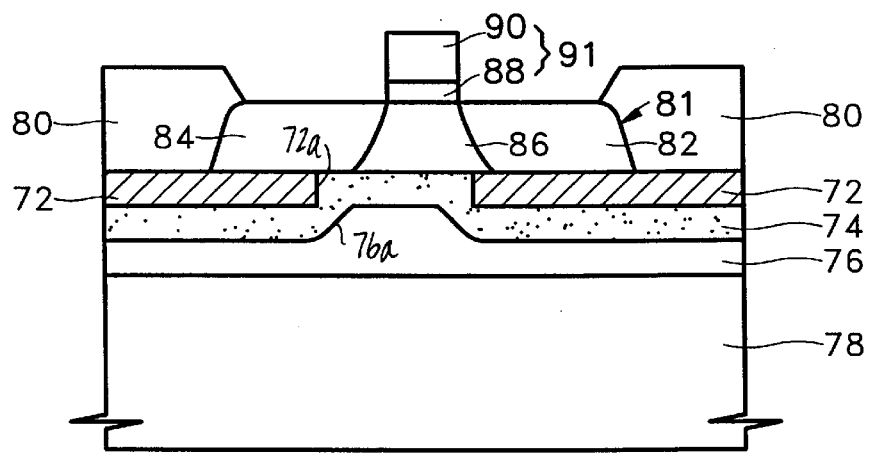

The composite structure of FIG. 9 is then inverted and a second face of the first semiconductor substrate 70 is planarized to define a second semiconductor layer of predetermined thickness extending opposite the second electrically insulating layer 72 and the plurality of first openings therein, as illustrated best by FIG. 10. The step of planarizing the first semiconductor substrate 70 may be performed using a chemical-mechanical polishing step. The second semiconductor layer is then partitioned into a plurality of semiconductor active regions 81 by using isolation techniques to define a plurality of field oxide isolation regions 80 which preferably consume the thickness of the second semiconductor layer so that the active regions 81 are isolated from each other on the second electrically insulating layer 72. An insulated gate electrode 91 is then defined on a semiconductor active region 81 using conventional techniques. Here, the insulated gate electrode 91 is preferably defined to be laterally offset relative to a respective first opening 72a. The insulated gate electrode 91 may comprise a gate oxide layer 88 and a gate electrode 90. Next, source and drain regions 84 and 82 are defined in a self-aligned manner in the active region 81. The source and drain regions 84 and 82 define a channel region 86 therebetween. For example, the source and drain regions 84 and 82 may be formed by implanting source and drain region dopants using the insulated gate electrode 91 as an implant mask. In particular, according to one aspect of the present invention, the first semiconductor layer 74 and the second semiconductor layer may be of P-type conductivity and the source and drain regions 84 and 82 may be of N-type conductivity. However, because the gate electrode 91 is offset relative to the first opening 72a, both the source region 84 and the channel region 86 contact the portion of the first semiconductor layer 74 extending up into the first opening 72a. Thus, the source and channel regions 84 and 86 are indirectly electrically coupled to other adjacent active regions 81 by the first semiconductor layer 74 so that floating body effects (FBE) and short channel effects (SCE) can be reduced.

Figure 11:
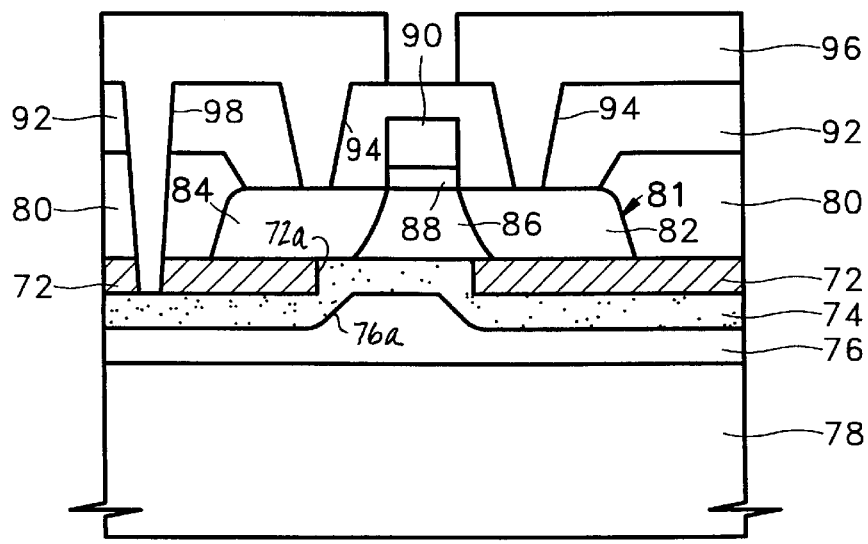

Referring now to FIG. 11, a passivation layer 92 is the deposited on the intermediate structure of FIG. 10. Contact holes 94 and 98 are then formed in the passivation layer 92 to expose the source and drain regions 84 and 82 and the first semiconductor layer 74, as illustrated. A layer of metallization may then be deposited on the passivation layer 92 and in the contact holes 94 and 98. The layer of metallization may then be patterned as source and drain electrodes or contacts 96, using conventional techniques.

Thus, an SOI field effect transistor can be formed in an active region 81 and defined so that at least a portion of the transistor's channel region 86 contacts the first semiconductor layer 74. Also, the transistor's source region 84 may also contact the first semiconductor layer 74 to promote the movement of charge carriers (e.g., holes). Here, the conductivity of the first semiconductor layer 74 is preferably substantially higher than the conductivity of the channel region 86 so it is possible to limit variations in the threshold voltage of the transistor and to reduce floating body effects (FBE) by limiting any parasitic accumulation of holes in the channel region. The use of a highly doped first semiconductor layer 74 also limits short channel effects (SCE) by acting as a punchthrough barrier.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a semiconductor-on-insulator field effect transistor, comprising the steps of:

forming a substrate comprising a first electrically insulating layer having an insulating mesa extending therefrom, a first semiconductor layer covering the insulating mesa and a second electrically insulating layer having a first opening therein which exposes a first portion of the first semiconductor layer extending opposite the insulating mesa; and forming a field effect transistor having a channel region directly electrically connected to the first semiconductor layer at the first opening in the second electrically insulating layer.

2. A method of forming a semiconductor-on-insulator field effect transistor, comprising the steps of:

forming a substrate comprising a first electrically insulating layer having an insulating mesa extending therefrom, a first semiconductor layer covering the insulating mesa and a second electrically insulating layer having a first opening therein which exposes a first portion of the first semiconductor layer extending opposite the insulating mesa:

forming a field effect transistor having a channel region electrically coupled to the first semiconductor layer at the first opening in the second electrically insulating layer forming a contact hole in the second electrically insulating layer to expose a second portion of the first semiconductor layer;

forming a drain contact ohmically connected to a drain region of the field effect transistor; and forming a source contact ohmically connected to a source region of the field effect transistor and the second portion of the first semiconductor layer.

3. A method of forming a semiconductor-on-insulator field effect transistor, comprising the steps of:

forming a substrate comprising a first electrically insulating layer having an insulating mesa extending therefrom, a first semiconductor layer covering the insulating mesa and a second electrically insulating layer having a first opening therein which exposes a first portion of the first semiconductor layer extending opposite the insulating mesa, and forming a field effect transistor having a channel region electrically coupled to the first semiconductor layer at the first opening in the second electrically insulating layer, and wherein said step of forming a substrate comprises the steps of:

forming the second electrically insulating layer on a first face of a semiconductor substrate;

patterning the second electrically insulating layer so that the first opening exposes the first face of the semiconductor substrate;

forming the first semiconductor layer on the second electrically insulating layer and in the first opening therein; and forming the first electrically insulating layer on the first semiconductor layer.

4. The method of claim 3, wherein said step of forming a field effect transistor is preceded by the step of planarizing the first electrically insulating layer at a surface thereof extending opposite the first semiconductor layer.

5. The method of claim 3, wherein the insulating mesa is self-aligned to the first opening.

6. The method of claim 5, wherein said step of forming a field effect transistor is preceded by the step of forming field oxide isolation regions in the semiconductor substrate to define an active region therein which is electrically connected to the first semiconductor layer at the first opening in the second electrically insulating layer.

7. The method of claim 6, wherein said step of forming field oxide isolation regions in the semiconductor substrate is preceded by the step of planarizing a second face of the semiconductor substrate extending opposite the first face.

8. The method of claim 7, wherein said step of forming a field effect transistor comprises forming a field effect transistor in the active region.

9. The method of claim 8, wherein said step of forming a field effect transistor comprises forming an insulated gate electrode on the planarized second face.

10. The method of claim 9, wherein said step of forming a field effect transistor comprises forming a field effect transistor in the active region so that the source and channel regions of the field effect transistor form rectifying and nonrectifying junctions with the first semiconductor layer, respectively.

11. The method of claim 9, wherein said step of forming a field effect transistor comprises forming a field effect transistor in the active region so that the source and channel regions of the field effect transistor form nonrectifying junctions with the first semiconductor layer.

12. A method of forming a semiconductor-on-insulator substrate, comprising the steps of:

forming a second electrically insulating layer on a first face of a first semiconductor substrate;

patterning the second electrically insulating layer to define a plurality of first openings therein which expose respective portions of the first face of the semiconductor substrate;

forming a first semiconductor layer on the second electrically insulating layer and in the plurality of first openings therein;

forming a first electrically insulating layer on the first semiconductor layer;

planarizing a second face of the first semiconductor substrate to define a second semiconductor layer extending opposite the second electrically insulating layer and the plurality of first openings therein; and forming field oxide isolation regions at the planarized second face to convert the second semiconductor layer into a plurality of semiconductor active regions which are electrically connected to the first semiconductor layer at respective first openings in the second electrically insulating layer.

13. The method of claim 12, wherein said step of planarizing the second face of the first semiconductor substrate comprises planarizing the second face of the first semiconductor substrate to define a second semiconductor layer having a first thickness; and wherein said step of forming field oxide isolation regions comprises forming field oxide isolation regions having a second thickness greater than the first thickness.

14. The method of claim 13, wherein said step of planarizing the second face of the first semiconductor substrate is preceded by the step of planarizing the first electrically insulating layer.

15. The method of claim 14, wherein said step of planarizing the first electrically insulating layer is followed by the step of bonding a second semiconductor substrate to the first electrically insulating layer.

16. The method of claim 15, further comprising the steps of forming at least one semiconductor device in each of the semiconductor active regions.

17. The method of claim 16, wherein said step of forming at least one semiconductor device comprises forming a field effect transistor in one of the semiconductor active regions so that the source and channel regions of the field effect transistor form semiconductor junctions selected from the group consisting of rectifying and nonrectifying semiconductor junctions, with the first semiconductor layer, but the drain region of the field effect transistor does not form a semiconductor junction with the first semiconductor layer.

18. The method of claim 17, wherein said step of forming a field effect transistor comprises the steps of forming a contact hole extending through one of the field oxide isolation regions and the second electrically insulating layer to expose the first semiconductor layer; and then forming a source contact in the contact hole.

* * * * *